(12) United States Patent
Lu

(10) Patent No.: US 7,199,616 B2
(45) Date of Patent: Apr. 3, 2007

(54) METHOD AND APPARATUS TO GENERATE BREAK BEFORE MAKE SIGNALS FOR HIGH SPEED TTL DRIVER

(75) Inventor: Timothy Lu, Campbell, CA (US)

(73) Assignee: Exar Corporation, Fremont, CA (US)

( * ) Notice: Subject to any disclaimer, the term of this patent is extended or adjusted under 35 U.S.C. 154(b) by 94 days.

(21) Appl. No.: 11/000,468

(22) Filed: Nov. 29, 2004

(65) Prior Publication Data

US 2006/0114028 A1 Jun. 1, 2006

(51) Int. Cl.
*H03K 19/094* (2006.01)
*H03H 11/26* (2006.01)

(52) U.S. Cl. .............................. 326/83; 326/72; 326/86; 327/261

(58) Field of Classification Search ................... 326/83, 326/86, 68, 70–72; 327/261
See application file for complete search history.

(56) References Cited

U.S. PATENT DOCUMENTS

| | | | | |
|---|---|---|---|---|
| 5,272,729 A | * | 12/1993 | Bechade et al. ............ | 375/371 |
| 5,519,344 A | * | 5/1996 | Proebsting ................... | 327/108 |
| 5,926,050 A | * | 7/1999 | Proebsting ................... | 327/170 |
| 6,163,174 A | * | 12/2000 | Friedman et al. ............ | 326/108 |
| 6,586,973 B2 | * | 7/2003 | Yokoyama et al. .......... | 327/108 |

* cited by examiner

*Primary Examiner*—James Cho
*Assistant Examiner*—Jason Crawford
(74) *Attorney, Agent, or Firm*—Townsend and Townsend and Crew LLP

(57) ABSTRACT

A driver includes, in part, a delay chain having disposed therein a multitude of accessible nodes, and a control logic coupled to the various nodes of the delay chain to generate the signals applied to the gate terminals of the PMOS and NMOS transistors disposed in the driver. The nodes that are accessed and tapped may or may not be the successive nodes disposed along the delay chain. Optionally four nodes of the delay chain are tapped to supply signals to the control logic. Two of the nodes, carrying in-phase signals, are tapped to generate a first signal, which is used to generate a second signal driving the NMOS transistor. The other two nodes, carrying in-phase signals, are tapped to generate a third signal, which is used to generate a fourth signal driving the PMOS transistor. The first signal is 180° out-of-phase with respect to the third signal.

20 Claims, 2 Drawing Sheets

METHOD AND APPARATUS TO GENERATE BREAK BEFORE MAKE SIGNALS FOR HIGH SPEED TTL DRIVER

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention relates to electronic circuits, and more particularly to high-speed TTL drivers.

Transistor-transistor logic, commonly referred to as TTL logic, is widely known. A TTL logic circuit is typically driven by a TTL driver circuit adapted to supply a voltage that may vary from 0.8 (VOL, output low maximum) to 2 (VOH, output high minimum) volts. One type of TTL driver circuit (hereinafter alternatively referred to as TTL driver) uses series-connected P-channel MOS (PMOS) and N-channel MOS (NMOS) transistors at its output stage. The PMOS transistor is adapted to supply the high logic voltage level, and the NMOS transistor is adapted to supply the low logic voltage level. The smaller the time period during which both the PMOS and the NMOS transistors are on, the smaller the current consumption. Therefore, ideally the PMOS and NMOS transistors should not be on at the same time.

Conventional TTL drivers include a feed-back circuitry adapted to minimize the overlapping on states of the PMOS and NMOS transistors. FIG. 1 is a transistor schematic diagram of a prior art TTL driver 100. TTL driver 100 includes output stage 120 and control logic 130. Output stage 120 includes PMOS transistor 102 and NMOS transistor 104. Control logic 130 includes inverters 106, 108, 122, 124, NAND gate 110, NOR gate 112, and resistors 114, and 116. As seen from FIG. 1, TTL driver 100 includes a feedback circuitry that feeds the voltage applied to the gate terminal of NMOS transistor 104 to the gate terminal of PMOS Transistors 102 via NAND gate 110, and feeds the voltage applied to the gate terminal of PMOS transistor 102 to the gate terminal of NMOS transistor 104 via NOR gate 112.

When the voltage signal applied to node Vin goes high, the voltage at node A goes high, causing the voltage at node C to go low, thereby causing NMOS transistor 104 to turn off. The low voltage at node C causes the voltage at node D to go high, thereby causing the voltage at node B to go low, which in turn, turns on PMOS transistor 102. Conversely, when the voltage signal applied to node Vin goes low, the voltage at node A goes low, causing the voltage at node B to go high, thereby causing PMOS transistor 102 to turn off. The high voltage at node B causes the voltage at node E to go low, thereby causing the voltage at node C to go high, which in turn, turns on NMOS transistor 104. By turning off one of the transistors off before turning on the other transistor on in output stage 120, referred to also as break-before-make, the crow bar current, i.e., the current from supply voltage Vdd to the ground terminal via transistors 102 and 104 is eliminated thus also preventing ground bounce and power bounce. Resistors 114 and 116 are adapted to reduce overshoot, and allow a soft turn on of the PMOS and NMOS transistors.

One drawback of conventional TTL drivers, such as TTL driver 100 is that because it uses a feedback circuitry, it is not adapted for use in high-speed circuits. The speed limitation is partly due to the following factors. In order for the voltage present on node Vp to go low to turn on PMOS transistor 102, the voltage at node D must go high. Node D has the delay of $T_1$ with respect to node A and defined by the following:

$$T_1 = T_{inv} + T_{RC1} + T_{NOR}$$

where $T_{inv}$ is the delay across inverter 124, $T_{RC1}$ is the RC delay associated with the resistance 116 and the gate capacitance of transistor 104, and $T_{NOR}$ is the delay across NOR gate 112. Therefore, the delay $T_2$ for the signal transition at node A to propagate to node Vp is the following:

$$T_2 = T_1 + T_{RC2} + T_{NAND}$$

where $T_{RC2}$ is the RC delay associated with the resistance 114 and the gate capacitance of transistor 102, and $T_{NAND}$ is the delay across NAND gate 110.

Accordingly, the on and off periods of transistors 102 and 104 occurs roughly in half the period of signal Vin. Therefore, if signal Vin has a frequency of 200 MHz, the on periods of both PMOS transistor 102 and NMOS transistor 104 is roughly 2 nsec. As the window during which output stage 120 may be operative begins to get narrower, TTL driver 100 starts to become less effective thus limiting the speed of TTL driver 100.

FIG. 2 is an exemplary timing diagram associated with TTL driver 100. Before voltage signal Vp make a high-to-low transition 160 to turn on PMOS transistor 102, NMOS transistor 104 is turned off by a high-to-low transition 150 of voltage signal Vn. Similarly, before voltage signal Vn make a low-to-high-to transition 180 to turn on NMOS transistor 104, PMOS transistor 102 is turned off by a low-to-high transition 170 of voltage signal Vp. The increase in the required speed of operation, as well as process and temperature variations may cause delay $T_2$ to become so large as to cause window $T_{window}$ defined by transitions 160 and 170 to get narrower and NMOS transistor 104 and PMOS transistor 102 to be on at the same time. As $T_{window}$ gets narrower, caused by weakening of the on-state of transistor 102, output driver 102 may not be able to drive the load (not shown), thus disabling output stage 120 from switching and rendering TTL driver 100 ineffective.

BRIEF SUMMARY OF THE INVENTION

In accordance with one embodiment of the present invention, a driver includes, in part, a delay chain having disposed therein a multitude of accessible nodes, and a control logic coupled to the various nodes of the delay chain to generate the signals applied to the gate terminals of the PMOS and NMOS transistors also disposed in the driver. In some embodiments, the delay chain nodes that are accessed and tapped may be successive nodes disposed along the delay chain. In other embodiments, the tapped nodes may not be successive nodes disposed along the delay chain.

In some embodiments, four nodes of the delay chain are tapped to supply signals to the control logic. In such embodiments, the two delay chain nodes that are tapped to generate the voltage applied to the gate terminal of the PMOS transistor, supply first and second signals that are in phase. Similarly, the two delay chain nodes that are tapped to generate the voltage applied to the gate terminal of the NMOS transistor, supply third and fourth signals that are in phase. The first and second signals are 180° out-of-phase with respect to the third and fourth signals.

In some embodiments, the delay chain includes a string of inverters, and the control logic includes first and second multitude of gates. The first chain of gates is configured to receive the first and second signals and generate the voltage applied to the gate terminal of the NMOS transistor. The second chain of gates is configured to receive the third and fourth signals and generate the voltage applied to the gate terminal of the PMOS transistor. In some embodiments, the logic gate, in each chain of gates, that is adapted to receive the signals from the delay chain, performs the same logic function. In some embodiments this logic function may be a NAND function. The logic gate performing the NAND function generate signals that are 180° out-of-phase with respect to one another.

DETAILED DESCRIPTION OF THE INVENTION

Figure 1:
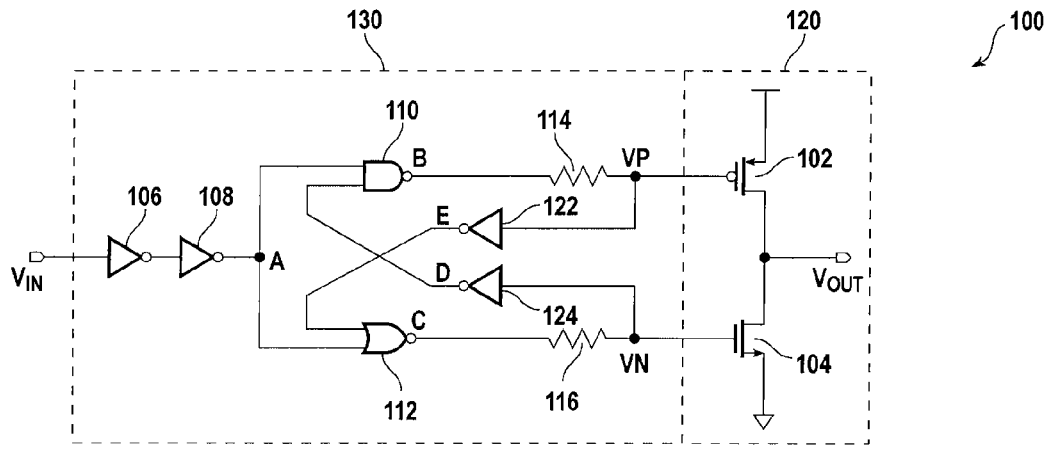
FIG. 1 is a transistor schematic diagram of a TTL driver, as known in the prior art.
Figure 2:
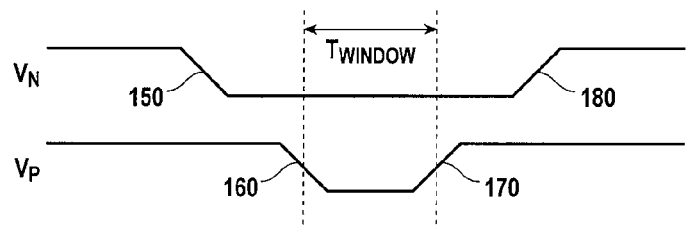
FIG. 2 is an exemplary timing diagram associated with the TTL driver of FIG. 1.
Figure 3:
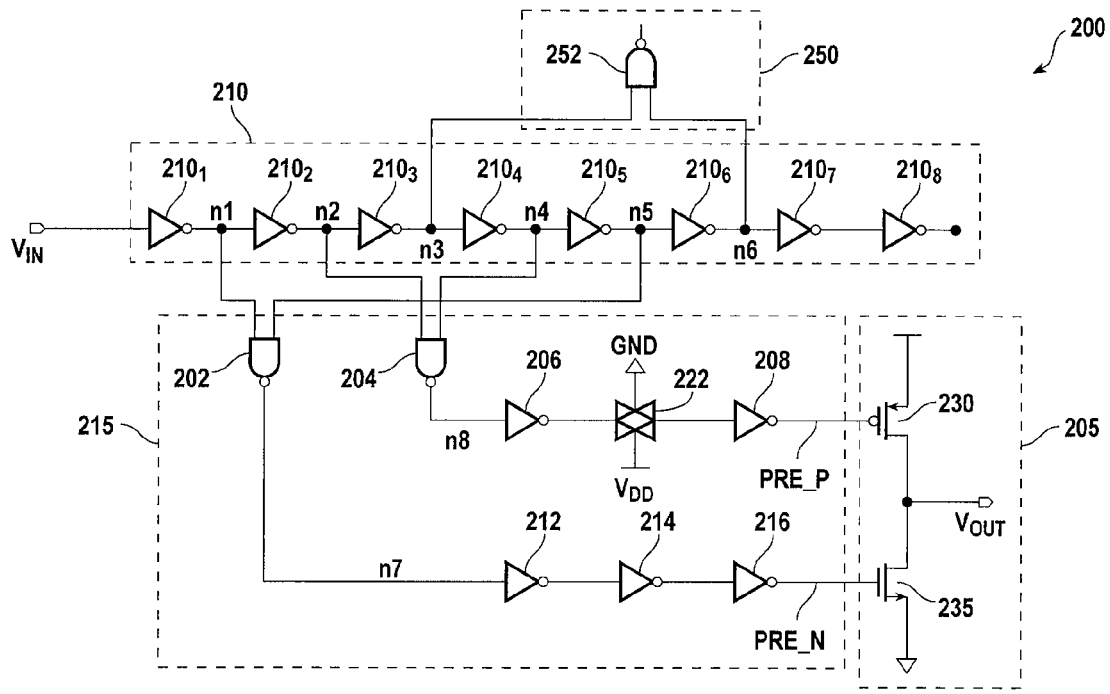
FIG. 3 is a transistor schematic diagram of a TTL driver, in accordance with one embodiment of the present invention.

FIG. 3 is a schematic diagram of a TTL driver 200, in accordance with one embodiment of the present invention. TTL driver 200 is shown as including an output stage 205, a delay chain having multiple accessible nodes 210, and a control logic 215. Delay chain 210 is shown as including a multitude of inverters $210_i$, where i is an integer. It is understood that delay chain 210 may be adapted to include any other delay elements, such as buffers, etc. Seven such inverters are shown in FIG. 3. Control logic 215 is shown as including NAND gates 202, 204, inverter 206, 208, 212, 214, 216, and transmission gate 222. Output stage 205 is shown as including a PMOS transistor 230, and an NMOS transistor 235.

Delay chain 210 is adapted to provide a multitude of nodes each of which may be tapped to supply signals to control logic 215. Four such nodes, namely nodes n1, n2, n3, and n4 are shown as being tapped to supply signals to NAND gates 202, and 204. In the embodiment 200 shown in FIG. 3, nodes n1, n2, n3, and n4 are successive nodes of the delay chain. However, it is understood that in other embodiments, the tapped nodes may not be successive nodes. Furthermore, in the embodiment 200 shown in FIG. 3, four nodes are shown as being tapped to supply signals to control logic 215. However, it is understood that in other embodiments, more than four nodes may be tapped in delay chain 210 to supply signals to control logic 215.

Because exemplary delay chain 210 includes inverters, the signals tapped from nodes n1 and n2 are 180° out of phase, and signals tapped from nodes n2 and n3 are 180° out of phase, etc. Similarly, the signals tapped from nodes n1 and n3 are in phase and 180°, and signals tapped from nodes n2 and n4 are in phase, etc. The in-phase signals present on nodes n1 and n5, are applied to NAND gate 202 whose output signal is supplied to node n7. Similarly, the in-phase signals present on nodes n2 and n4 are applied to NAND gate 204 whose output signal is supplied to node n8.

The nodes disposed along delay chain 210, as well as the gates supplying voltage to nodes n7, and n8 are chosen such that the signals on nodes n7 and n8 are 180° out-of-phase. Inverters 212, 214, and 216 are disposed between nodes n7 and pre-n. Therefore, the signal present on node n7 is 180° out-of-phase with respect to the signal present on node pre_n applied to the gate terminal of NMOS transistor 235. Inverters 206 and 208 are, in part, disposed between node n8 and node pre-p applied to the gate terminal of PMOS transistor 230. Therefore, the signal present on node n8 is in-phase with respect to the signal present on node pre_p. Transmission gate 22 is disposed between inverters 206 and 208 so that the time delay between node pair pre_p, n8 is substantially the same as the delay between the node pair pre_n, n7. Accordingly, following a transition on input signal Vin, node pre_p reaches the same voltage level as node pre_n after a know delay. TTL driver 200 is operative at very high frequencies. Furthermore, by tapping into various nodes of delay chain 210 the delay time between turning off of one of the transistors in the output stage and turning on of the other transistor in the output stage may be varied. In other words, in accordance with the present invention, the brake-before-make period is programmable.

Figure 4:
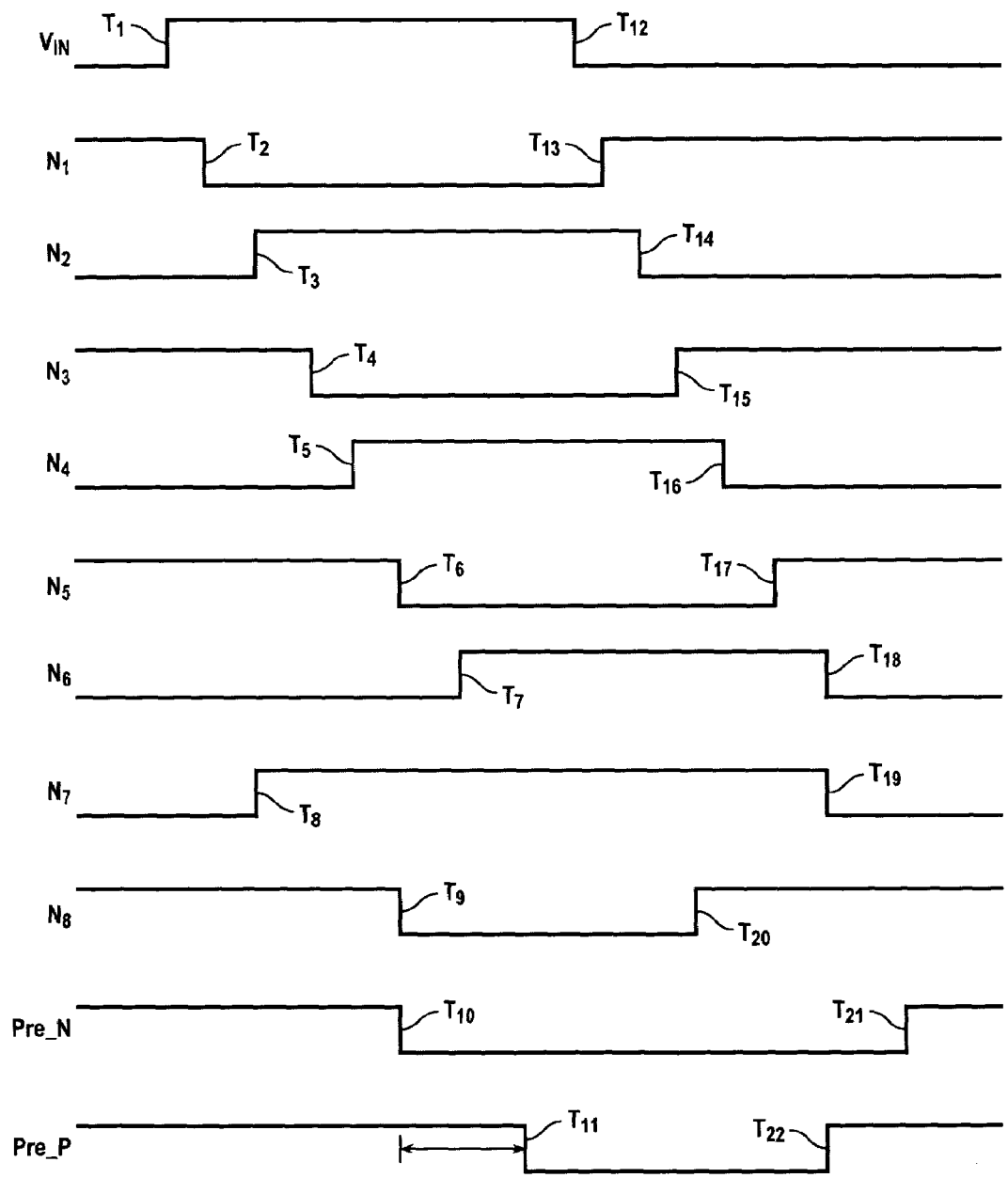
FIG. 4 is an exemplary timing diagram associated with the TTL driver of FIG. 3.

FIG. 4 is an exemplary timing diagram associated with the TTL driver 200, in accordance with one embodiment. Signal Vin is shown as making a low-to-high transition at time $T_1$. At successive times $T_2$, $T_3$, $T_4$, $T_5$, $T_6$, $T_7$ respectively, the signals at nodes n2, n3, n4, n5 and n6 make either low-to-high or high-to-low transitions. The delay between, for example, times $T_1$ and $T_2$ corresponds to one inverter delay of delay chain 210. The signal on node n7 makes a low-to-high transition at time $T_8$, which occurs after time $T_2$. The signal on node n8 makes a high-to-low transition at time $T_9$, which occurs after time $T_5$. At time $T_{10}$ signal pre_n makes a high-to-low transition causing NMOS transistor 235 to turn off. At time $T_{11}$ signal pre_p makes a high-to-low transition causing PMOS transistor 230 to turn on. Because time $T_{11}$ occurs after time $T_{10}$, NMOS transistor 235 is turned off before PMOS transistor 230 is turned on thus achieving break-before-make.

At time $T_{12}$ signal Vin is shown as making a high-to-low transition. At successive times $T_{13}$, $T_{14}$, $T_{15}$, $T_{16}$, $T_{17}$, $T_{18}$ respectively, the signals at nodes n2, n3, n4, n5 and n6 make either low-to-high or high-to-low transitions. The signal on node n7 makes a high-to-low transition at time $T_{19}$. The signal on node n8 makes a low-to-high transition at time $T_{20}$, which occurs before time $T_{19}$. At time $T_{22}$ signal pre_p makes a low-to-high transition causing PMOS transistor 230 to turn off. At time $T_{21}$, which occurs after time $T_{22}$ signal pre_n makes a low-to-high transition causing NMOS transistor 235 to turn on. Because time $T_{22}$ occurs before time $T_{21}$, PMOS transistor 230 is turned off before NMOS transistor 235 thus achieving break-before-make.

TTL driver 200 is also shown as including dummy circuit 250, which in turn is shown as including a two-input NAND gate 252. Dummy circuit 250 is a load matching circuit adapted to ensure that the various nodes disposed in delay chain 210 see the same amount of capacitive load. For example, nodes n3 and n5 are not tapped, whereas nodes n1, n2, n4 and n5 are tapped, each of which sees the load associated with the next delay stage as well as the load associated with the input terminal of the NAND gate that it is coupled to. Because each of nodes n3 and n6 is also coupled to one of the input terminals of NAND gate 252, node n3 and n6 see the same amount of load as do the other nodes.

The above embodiments of the present invention are illustrative and not limiting. Various alternatives and equivalents are possible. The invention is not limited by the type of delay chain, or control circuitry of the present invention. The invention is not limited by the type of integrated circuit in which the present invention may be disposed. Nor is the invention limited to any specific type of process technology, e.g., CMOS, Bipolar, or BICMOS that may be used to manufacture the present invention. Other additions, subtractions or modifications are obvious in view of the present invention and are intended to fall within the scope of the appended claims.

What is claimed is:

1. A driver circuit comprising:
   a delay chain having disposed therein a plurality of accessible nodes;
   a PMOS transistor and an NMOS transistor; and
   a control logic coupled to at least first, second, third and fourth nodes of the delay chain to receive signals therefore, wherein the signals received from said first and second nodes are adapted to generate a signal applied to a gate terminal of the NMOS transistor, and wherein the signals received from said third and fourth nodes are adapted to generate a signal applied to a gate terminal of the PMOS transistor, wherein the signals received from said first and second nodes are in-phase with respect to one another.

2. The driver circuit of claim 1 wherein the signals received from said third and fourth nodes are in-phase with respect to one another.

3. The driver circuit of claim 2 wherein the signals received from said first and second nodes are 180° out-of-phase with respect to the signals received from said third and fourth nodes.

4. The driver circuit of claim 3 wherein said delay chain comprises a string of inverters.

5. The driver circuit of claim 4 wherein said control logic comprises first and second logic gates, wherein said first logic gate is coupled to the first and second nodes of the delay chain and supplies a fifth signal used to generate the signal applied to the gate terminal of the NMOS transistor, and wherein said second logic gate is coupled to the third and fourth nodes of the delay chain and supplies a sixth signal used to generate the signal applied to the gate terminal of the PMOS transistor.

6. The driver circuit of claim 5 wherein said first and second logic gates disposed in the control logic perform the same logic function.

7. The driver circuit of claim 6 wherein said first and second logic gates disposed in the control logic are NAND gates.

8. The driver circuit of claim 6 wherein the fifth and sixth signals are 180° out-of-phase with respect to one another.

9. The driver circuit of claim 8 wherein said control logic further comprises a first chain of logic gates adapted to receive the fifth signal and generate the signal applied to the gate terminal of the NMOS transistor, and a second chain of logic gates adapted to receive the sixth signal and generate the signal applied to the gate terminal of the PMOS transistor.

10. The driver circuit of claim 9 wherein said first chain of logic gates further comprises a first plurality of inverters, and wherein said second chain of logic gates further comprises a second plurality of inverters and a transmission gate.

11. The driver circuit of claim 10 further comprising:
    a dummy circuit adapted to match the RC loads associated with the first, second, third and fourth nodes of the delay chain to the RC loads of the remaining nodes of the delay chain.

12. A method comprising:
    receiving at least first, second, third and fourth signals of a delay chain;
    generating a fifth signal in response to said first and second signals;
    generating a sixth signal in response to said third and fourth signals;
    generating a seventh signal from the fifth signal to apply to a gate terminal of a PMOS transistor; and
    generating an eight signal from the sixth signal to apply to a gate terminal of an NMOS transistor, wherein said first and second signals are in-phase with respect to one another.

13. The method of claim 12 wherein said third and fourth signals are in-phase with respect to one another.

14. The method of claim 13 wherein the first and second signals are 180° out-of-phase with respect to the third and fourth signals.

15. The method of claim 14 wherein said delay chain comprises a string of inverters.

16. The method of claim 15 wherein said fifth and sixth signals are generated by at least a pair of logic gates configured to perform the same logic function.

17. The method of claim 16 wherein the at least pair of logic gates are adapted to perform NAND logic operations.

18. The method of claim 17 wherein the fifth and sixth signals are 180° out-of-phase with respect to one another.

19. The method of claim 18 further comprising:
    generating the seventh voltage from the fifth voltage using a first chain of logic gates that comprises a first plurality of inverters; and
    generating the eight voltage from the sixth voltage using a second chain of logic gates that comprises a second plurality of inverters and a transmission gate.

20. The method of claim 19 further comprising:
    matching the RC load associated with first, second, third and fourth nodes supplying the first, second, third, and fourth voltages of the delay chain to the RC loads of remaining nodes of the delay chain.

* * * * *